United States Patent
Yang et al.

(10) Patent No.: US 9,663,860 B2
(45) Date of Patent: May 30, 2017

(54) SILICON-CARBON COMPOSITE ANODE MATERIAL FOR LITHIUM ION BATTERIES AND A PREPARATION METHOD THEREOF

(75) Inventors: Jun Yang, Shanghai (CN); Pengfei Gao, Shanghai (CN); Haiping Jia, Shanghai (CN); Jiulin Wang, Shanghai (CN); Yanna Nuli, Shanghai (CN)

(73) Assignee: BOSCH (CHINA) INVESTMENT LTD., Shanghai (CN)

( * ) Notice: Subject to any disclaimer, the term of this patent is extended or adjusted under 35 U.S.C. 154(b) by 774 days.

(21) Appl. No.: 14/005,791

(22) PCT Filed: Mar. 17, 2012

(86) PCT No.: PCT/CN2012/072491
§ 371 (c)(1),
(2), (4) Date: Dec. 30, 2013

(87) PCT Pub. No.: WO2012/126338
PCT Pub. Date: Sep. 27, 2012

(65) Prior Publication Data
US 2014/0147751 A1    May 29, 2014

(30) Foreign Application Priority Data
Mar. 18, 2011    (CN) .......................... 2011 1 0065254

(51) Int. Cl.
*H01M 4/36* (2006.01)
*C23C 18/12* (2006.01)
(Continued)

(52) U.S. Cl.
CPC .......... *C23C 18/1275* (2013.01); *C23C 16/26* (2013.01); *H01M 4/133* (2013.01);
(Continued)

(58) Field of Classification Search
CPC ..... H01M 4/366; C23C 16/26; C23C 18/1275
See application file for complete search history.

(56) References Cited

U.S. PATENT DOCUMENTS

| 2009/0186267 A1 | 7/2009 | Tiegs | |
| 2011/0111294 A1* | 5/2011 | Lopez | H01M 4/134 |
| | | | 429/217 |
| 2014/0030599 A1* | 1/2014 | Lee | C23C 18/08 |
| | | | 429/231.8 |

FOREIGN PATENT DOCUMENTS

| CN | 101222039 | 7/2008 |
| CN | 101510602 | 8/2009 |

(Continued)

OTHER PUBLICATIONS

"Synthesis and characterization of a novel porous and self-assembled hybrid materials", Chapter IV Synthesis of mesoporous polycrystal silicon, Fudan University, Apr. 18, 2008.

(Continued)

*Primary Examiner* — Stewart Fraser
*Assistant Examiner* — Rachel L Zhang
(74) *Attorney, Agent, or Firm* — Norton Rose Fulbright US LLP

(57) ABSTRACT

Disclosed in the invention are a silicon-carbon composite anode material for lithium ion batteries and a preparation method thereof The material consists of a porous silicon substrate and a carbon coating layer. The preparation method of the material comprises preparing a porous silicon substrate and a carbon coating layer. The silicon-carbon composite anode material for lithium ion batteries has the advantages of high reversible capacity, good cycle performance and good rate performance. The material respectively shows reversible capacities of 1,556 mAh, 1,290 mAh, 877 mAh and 474 mAh/g at 0.2 C, 1 C, 4 C and 15 C rates; the specific capacity remains above 1,500 mAh after 40 cycles (Continued)

at the rate of 0.2 C and the reversible capacity retention rate is up to 90 percent.

7 Claims, 5 Drawing Sheets

(51) Int. Cl.
*H01M 4/133* (2010.01)
*H01M 4/134* (2010.01)
*H01M 4/1393* (2010.01)
*H01M 4/1395* (2010.01)
*H01M 10/052* (2010.01)
*H01M 4/38* (2006.01)
*H01M 4/587* (2010.01)
*C23C 16/26* (2006.01)

(52) U.S. Cl.
CPC ......... *H01M 4/134* (2013.01); *H01M 4/1393* (2013.01); *H01M 4/1395* (2013.01); *H01M 4/366* (2013.01); *H01M 4/386* (2013.01); *H01M 4/587* (2013.01); *H01M 10/052* (2013.01)

(56) References Cited

FOREIGN PATENT DOCUMENTS

| | | |
|---|---|---|
| CN | 101527357 | 9/2009 |
| CN | 100576610 | 12/2009 |
| CN | 101609891 | 12/2009 |
| CN | 102157731 | 8/2011 |
| JP | 2009032693 A | 2/2009 |
| JP | 2010-245096 | 10/2010 |

OTHER PUBLICATIONS

International Search Report for PCT/CN2012/072491, dated May 31, 2012.

* cited by examiner

SILICON-CARBON COMPOSITE ANODE MATERIAL FOR LITHIUM ION BATTERIES AND A PREPARATION METHOD THEREOF

FIELD OF THE INVENTION

The present invention relates to a battery electrode material and a preparation method thereof, particularly a silicon-carbon composite anode material for lithium ion batteries and a preparation method thereof.

BACKGROUND ART

Current commercial anode materials for lithium ion batteries mainly use graphite. However, theoretical specific capacity of graphite is only 372 mAh/g, which can not meet the development requirements of the new generation of high-capacity lithium ion batteries. Silicon has the highest theoretical lithium storage capacity (4200 mAh/g) and a low lithium deintercalation voltage platform (about 0.4V), thus it is the most potential new anode material for lithium ion batteries to replace graphite. However, in the charge-discharge process, silicon exhibits significant volume change, which leads to pulverization of the material particles and the destruction of conductive network within the electrode, limiting its commercial applications. In addition, the intrinsic conductivity of silicon is very low (only $6.7 \times 10^{-4}$ $Scm^{-1}$), thus it is not suitable for high current charge-discharge. On the other hand, the carbon-based material has a small lithium intercalation and deintercalation volume effect and high conductivity. The combination of silicon and carbon can effectively alleviate the volume effect of silicon, reduce the electrochemical polarization, and increase charge-discharge cycling stability. Chinese Patent application CN200510030785.8 discloses a lithium ion battery silicon/carbon/graphite composite anode material, which is prepared by a concentrated sulfuric acid carbonation method. This material consists of elemental silicon, graphite particles and amorphous carbon and does not have a porous structure. Its initial lithium deintercalation capacity is about 1000 mAh/g, but after 10 charge-discharge cycles, the capacity is attenuated by about 20%. Thus, its charge-discharge cycling stability is not good.

To further alleviate the volume effect of silicon, a silicon material having a porous structure is designed. Its internal pore volume reserves space for the volume expansion of silicon, the macroscopic volume change of the lithium storage material is reduced, the mechanical stress is relieved, thus the structural stability of the electrode is improved.

Chinese patent ZL200610028893.6 discloses a copper-silicon-carbon composite material having a nano-porous structure. It is prepared by a high-energy ball milling process. The pore size is 2 to 50 nm, the copper content is about 40 wt %, and the carbon content is about 30 wt %. The material shows a good charge-discharge cycling stability, but its reversible capacity is low, which is only about 580 mAh/g.

PCT/KR2008/006420 discloses a silicon nanowire-carbon composite material having a mesoporous structure. It is produced through an alumina template method. The silicon nanowire has a diameter of 3 to 20 nm, the diameter of the mesopore is 2 to 20 nm, and the carbon content is 5 to 10 wt %. The material has a charge-discharge capacity of 2000 mAh/g at the rate of 1 C. The cycling stability is better, but the process is complex, thus it is difficult to realize industrial production.

Angewandte Chemie International Edition, 2008, Issue 52, pages 10151-10154 reports a three-dimensional macroporous silicon-based material. Firstly, silicon tetrachloride is reduced with sodium naphthalene and butyl lithium is introduced therein to produce butyl-encapsulated silicone gel, followed by the addition of silica particles as a template, and then carbonization is carried out by heat treatment, finally the material is caustic etched by hydrofluoric acid, a macroporous silicon material is thus obtained. The macroporous silicon is of a single crystalline structure, whose average particle diameter is 30 µm or above, and the pore size is 200 nm. The reversible capacity of the material at the rate of 0.2 C is 2820 mAh/g, the cycle performance is good. However, its synthesis process is cumbersome, and a large amount of strongly corrosive and highly dangerous chemical reagents are necessary. The waste would affect the environment, and the production cost is high. Thus, it is not suitable for large-scale industrial applications.

Advanced Materials, 2012, Issue 22, pages 1 to 4 reports a macroporous silicon silver composite material. Firstly, elemental silicon having a three-dimensional macroporous structure is prepared by magnesium thermal reduction, then silver nanoparticles are deposited in the macro pores by silver mirror reaction, the silver content is 8 wt %. The macroporous silicon is of a single crystalline structure, its particle size is 1 to 5 µm, and the pore size is about 200 nm. Its initial lithium deintercalation capacity is 2917 mAh/g, and after 100 cycles, the deintercalation capacity remains above 2000 mAh/g. However, the use of silver would substantially increase the cost of production of the material, which is adverse to its industrial application.

SUMMARY OF THE INVENTION

The object of the present invention is to provide a silicon-carbon composite anode material for lithium ion batteries and a preparation method thereof The silicon-carbon composite anode material of the present invention has high capacity, excellent cycle stability and rate performance. The method for preparing the silicon-carbon composite anode material of the present invention is simple, low cost, and suitable for industrial production.

The structure of the silicon-carbon composite anode material for lithium ion batteries consists of a porous silicon substrate and a carbon coating layer, wherein the carbon coating layer accounts for 2 wt % to 70 wt %, it consists of amorphous carbon and has a thickness of 2 nm to 30 nm; the porous silicon substrate is of a polycrystalline structure, the particle size is 50 nm to 20 µm, the pore size is 2 nm to 150 nm, the pore volume is 0.1 $cm^3$/g to 1.5 $cm^3$/g, and the specific surface area is 30 $m^2$/g to 300 $m^2$/g.

The silicon-carbon composite anode material for lithium ion batteries of the present invention has a porous structure, which can effectively alleviate the volume effect of silicon in the charge-discharge process. Moreover, a uniform carbon coating layer is present on the surface of the particles, while maintaining a high capacity, the cycle stability and high-current charge-discharge characteristics of the anode materials are improved. According to the present invention, the carbon coating layer accounts for 2 wt % to 70 wt %. If the weight percentage is less than 2 wt %, the content is too low to enhance conductivity and stabilize the structure. On the other hand, if the weight percentage is greater than 70 wt %, the content is too high; due to the low capacity of the carbon coating layer itself, the specific capacity of the composite anode materials would be greatly reduced. Further, since the present invention does not contain precious metals, the production cost can be significantly reduced.

The method for preparing the silicon-carbon composite anode material for lithium ion batteries of the present invention is as follows, the recited parts are by weight:

(1) preparation of porous silicon substrate 1 to 3 parts of mesoporous silica and 2 to 4 parts of magnesium powder are placed in a high temperature furnace; the temperature is raised to 600 to 900° C. in an atmosphere of a protective gas, and temperature is kept for 2 to 10 hours before it is allowed to cool; then the materials are put into 40 to 100 parts of hydrochloric acid with a concentration of 1 to 12 mol/L and stirred for 6 to 18 hours; after 3 to 5 times of centrifugation at 3000 to 10,000 r/min, and vacuum drying at 70 to 120° C. for 6 to 18 hours, a porous silicon substrate is obtained;

(2) carbon coating the porous silicon substrate is placed in a high temperature furnace, where the temperature is raised to 600° C. to 1100° C. in an atmosphere of a protective gas; then a gaseous carbon source or a liquid carbon source is carried into the furnace by the protective gas, the temperature is kept for 1 to 12 hours; after the disassociation of the gaseous carbon source or the liquid carbon source, a carbon coating layer is formed on the surface of the porous silicon substrate, thus a silicon-carbon composite anode material for lithium ion batteries is obtained; or the porous silicon substrate and a solid carbon source are dispersed in a solvent; the mixture are dispersed homogeneously by an ultrasonic treatment and stirring; then the solvent is evaporated, the material is transferred into a high temperature furnace where the temperature is raised to 600° C. to 1100° C. in an atmosphere of a protective gas, the temperature is kept for 1 to 12 hours; after the disassociation of the solid carbon source, a carbon coating layer is formed on the surface of the porous silicon substrate, thus a silicon-carbon composite anode material for lithium ion batteries is obtained.

The protective gas used in the present invention is selected from the group consisting of argon, nitrogen, helium, a gas mixture of argon and hydrogen, and a gas mixture of nitrogen and hydrogen, the content of hydrogen in the gas mixture being 2% to 20% by volume.

The gaseous carbon source used in the present invention is selected from the group consisting of acetylene, methane, ethane, ethylene, propylene and carbon monoxide.

The liquid carbon source used in the present invention is selected from the group consisting of benzene, toluene, xylene, ethanol, n-hexane and cyclohexane.

The solid carbon source used in the present invention is selected from the group consisting of polyvinyl chloride, polyvinylidene fluoride, polyacrylonitrile, polyvinyl alcohol, polystyrene, phenolic resins, epoxy resins, coal tar pitch, petroleum pitch, sucrose and glucose. The molecular weight of polyvinyl chloride is in a range of 50,000 to 120,000, the molecular weight of polyvinylidene fluoride is in a range of 250,000 to 1,000,000, the molecular weight of polyacrylonitrile is in a range of 30,000 to 200,000, the molecular weight of the polyvinyl alcohol is in a range of 20,000 to 300,000, the molecular weight of polystyrene is in a range of 50,000 to 200,000, the molecular weight of phenolic resin is in a range of 500 to 10,000, the molecular weight of epoxy resin is in a range of 300 to 8000.

The solvent used in the present invention is selected from the group consisting of water, ethanol, ethyl ether, acetone, tetrahydrofuran, benzene, toluene, xylene, dimethyl formamide and N-methyl pyrrolidone.

In the present invention, the porous silicon substrate is prepared at a temperature of 600 to 900° C. If the temperature is below 600° C., the reduction reaction of the mesoporous silica is not sufficient. If the temperature is higher than 900° C., the grain size of the obtained product is too large. The temperature for coating carbon is in a range of 600 to 1100° C. If the temperature is below 600° C., carbonization is incomplete or the conductivity of carbon is not high. If the temperature is higher than 1100° C., impurities such as SiC are formed.

For the preparation method of the mesoporous silica used in the above method, please refer to for example Science, 1998, volume 279, Issue 5350, pages 548 to 552. 1 to 8 parts of ethylene oxide/propylene oxide block copolymer are dissolved in a solution of 10 to 50 parts of water, 0 to 9 parts of 1-butanol and 3 to 6 parts of 2 mol/L of hydrochloric acid. After stirring, 6 to 12 parts of tetraethyl orthosilicate is added to the mixture, and stirred at 10 to 50° C. for 12 to 36 hours. The mixture is then transferred into a hydrothermal reaction kettle, where the temperature is kept at 80° C. to 120° C. for 12 to 36 hours. After cooling, by centrifugation at 3,000 to 10,000 r/min, vacuum drying at 80° C. to 120° C., and calcination at 500° C. to 800° C. for 1 to 6 hours, mesoporous silica is obtained.

The silicon-carbon composite anode material for lithium ion batteries of the present invention consists of a porous silicon substrate and a carbon coating layer. The porous silicon substrate has a uniformly distributed porous structure, which not only effectively alleviates the volume effect of silicon during the lithium deintercalation process, but is also favorable for the penetration of the electrolyte and the transmission of lithium ions, the diffusion distance of lithium ions in silicon is reduced, and high current charge-discharge of the silicon anode is realized. The carbon coating layer also serves to enhance conductivity and maintain the structural stability of the material, so that the silicon-carbon composite anode material for lithium ion batteries of the present invention has the advantages of a high reversible capacity, good cycle performance and excellent rate performance. In the preparation method of the silicon-carbon composite anode material for lithium ion batteries of the present invention, firstly, the mesoporous silica is reduced with magnesium, a porous silicon substrate is obtained after pickling, and then a uniform carbon coating layer is coated on the porous silicon substrate surface so as to improve conductivity, with no use of noble metals. This method is simple, low cost, and is suitable for large-scale industrial production.

Using a lithium plate as the counter electrode, the silicon-carbon composite anode material for lithium ion batteries of the present invention can be assembled into a lithium ion battery. The lithium ion battery has electrolyte consisting of a lithium salt and a solvent. The lithium salt can be selected from the group consisting of inorganic salts, such as lithium hexafluorophosphate ($LiPF_6$), lithium tetrafluoroborate ($LiBF_4$) or lithium perchlorate ($LiClO_4$); and organic salts, such as lithium bis(oxalate)borate (LiBOB), lithium bis(trifluoromethanesulfonyl) imide (LiTFSI). The solvent contains at least one compound from the group consisting of ethylene carbonate (EC), propylene carbonate (PC), dimethyl carbonate (DMC) and diethyl carbonate (DEC). The concentration of the lithium salt in the electrolyte is less than 2 mol/L. Constant current charge-discharge tests are carried out at the rate of 0.2 C. The results show that the initial coulombic efficiency is 72%. The reversible capacity after 40 cycles remains above 1500 mAh/g, the capacity retention rate is up to 90%. Tests are carried out at rates of 0.2 C, 1

C, 4 C and 8 C, the silicon-carbon composite anode material for lithium ion batteries of the present invention shows reversible capacity of 1556 mAh/g, 1290 mAh/g, 877 mAh/g and 598 mAh/g respectively, wherein the current density at 0.2 C is 300 mA/g. Even if the charge-discharge tests are carried out at 15 C, a reversible capacity of 474 mAh/g is exhibited.

DETAILED DESCRIPTION OF THE INVENTION

Figure 1:
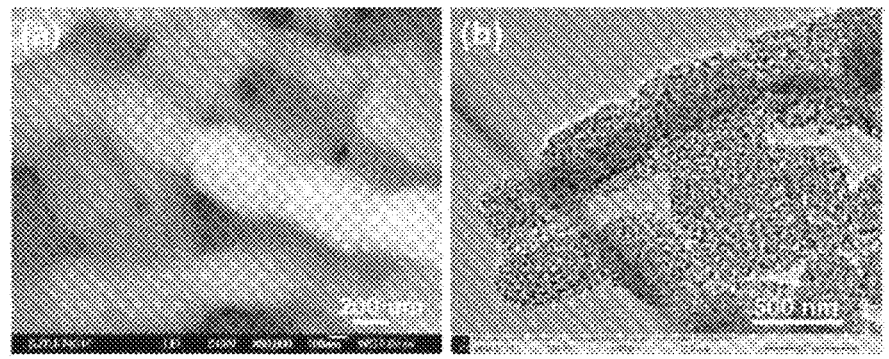
FIG. 1 shows the SEM image (a) and the TEM image (b) of the porous silicon substrate obtained in Example 1.

The following examples further illustrate the present invention, but the present invention is not limited to the following Examples.

Assembly of the lithium ion battery and the test method are described as follows.

The silicon-carbon composite anode material for lithium ion batteries of the present invention, 20 wt % of the binder (a N-methylpyrrolidone solution of polyvinylidene fluoride with a concentration of 2 wt %, or a styrene-butadiene rubber-sodium carboxymethyl cellulose emulsion) and 20 wt % of a conductive agent (SuperP conductive carbon black) were mixed and stirred uniformly, then the material was coated on a copper foil which is then placed in a drying oven at 60° C. to 80° C. The copper foil was punched into an electrode with a 12-16 mm diameter puncher. The electrode is placed in a vacuum oven and dried at 0° C. to 120° C. for 8 to 12 hours, then transferred into an argon-filled glove box. A lithium plate is used as a counter electrode, ENTEK PE porous membrane is used as a separator, 1 mol/L of lithium hexafluorophosphate in a mixed solution of ethylene carbonate with dimethyl carbonate (volume ratio 1:1) is used as the electrolyte. Thus a button battery CR2016 is assembled. Constant current charge-discharge performance test is carried out on a LAND battery test system (Wuhan Jinnuo Electronics Co., Ltd.). The charge-discharge cut-off voltage with respect to $Li/Li^+$ is 0.01 to 1.2 V, the charge-discharge rate is 0.05 C to15 C, wherein the current density at the rate of 0.2 C is 300 mA/g.

EXAMPLE 1

Preparation of mesoporous silica: 4.0 g of ethylene oxide/propylene oxide block copolymer (tradename: Pluronic P123) was dissolved in a mixed solution of 30.0 g of water and 120.0 g of hydrochloric acid (2 mol/L), after being stirred homogeneously, 8.4 g of tetraethyl orthosilicate (TEOS) was added therein. The mixture was then stirred at 35° C. for 24 hours and transferred into a hydrothermal reaction kettle where the temperature was kept at 100° C. for 24 hour. After being cooled, the mixture was centrifugalized at 4000 r/min, dried at 95° C., and then calcined at 550° C. in an air atmosphere for 2 hours. Thus, mesoporous silica was obtained.

(1) 0.3 g of mesoporous silica and 0.3 g of magnesium powder were placed in a high temperature furnace. In a gas mixture of argon and hydrogen (the content of hydrogen was 5% by volume), the temperature was raised to 650° C., and temperature was kept for 7 hours before it was allowed to cool. Then the materials were put into 25 ml of hydrochloric acid (2 mol/L) and stirred for 12 hours. After 4 times of centrifugation at 4000 r/min, and vacuum drying at 80° C. for 12 hours, a porous silicon substrate was obtained;

(2) The porous silicon substrate was placed in a high temperature furnace, where the temperature was raised to 900° C. in an atmosphere of argon. Then acetylene was carried into the furnace by argon (the volume ratio of argon and acetylene was 5:1 and the total flow rate was 300 ml/min), the temperature was kept for 4 hours. After the disassociation of acetylene, a carbon coating layer was formed on the surface of the porous silicon substrate, thus a silicon-carbon composite anode material for lithium ion batteries was obtained.

Figure 2:
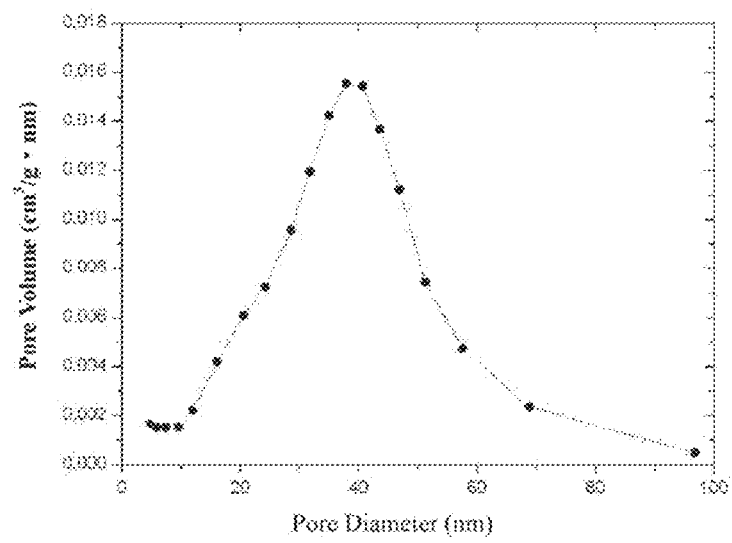
FIG. 2 shows the pore size distribution curve of the porous silicon substrate obtained in Example 1.
Figure 3:
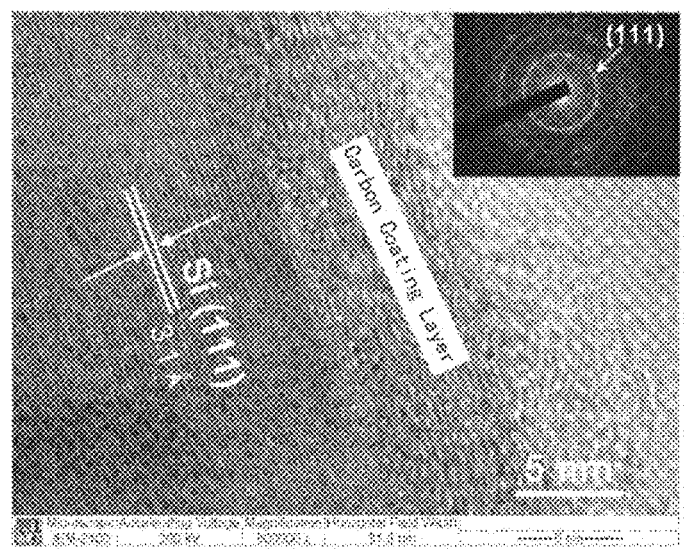
FIG. 3 shows the TEM image of the silicon-carbon composite anode material for lithium ion batteries obtained in Example 1.

The morphology and structure of the porous silicon substrate was shown in FIG. 1. The particles were approximate cylindrical with a length of approximately 600 nm and a diameter of approximately 400 nm, and the substrate shows a porous structure. The pore size distribution curve shown in FIG. 2 indicates that the pore size was about 40 nm, the pore volume was 0.56 $cm^3/g$, the specific surface area was 78.5 $m^2/g$. FIG. 3 shows a TEM image of the interface of the porous silicon substrate with the carbon coating layer. Silicon crystal plane (111) can be seen from FIG. 3, and the plane spacing was 0.31 nm; the carbon coating layer consists of amorphous carbon, and its thickness was approximately 7 nm. The carbon coating layer accounted for 40.0 wt %. It can be seen from the electron diffraction image in FIG. 3 that the silicon was of a polycrystalline structure. The polycrystalline diffraction ring having the smallest diameter in the image corresponds to (111) crystal plane of the silicon.

Figure 4:
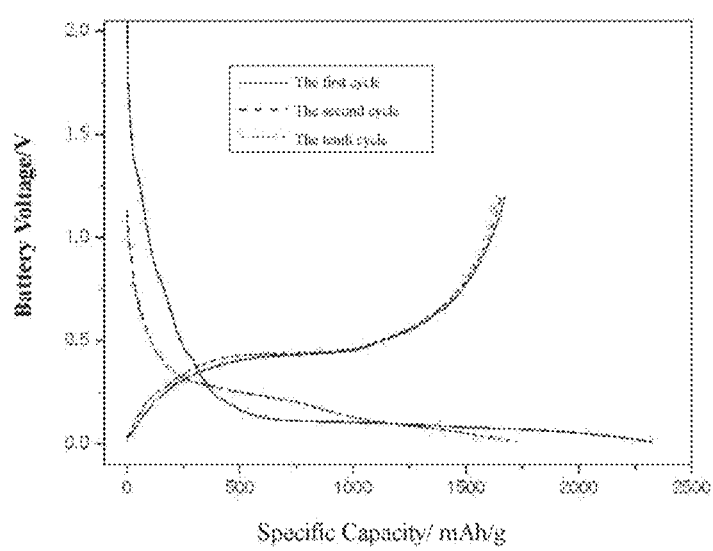
FIG. 4 shows the charge-discharge curve at the first, the second and the tenth cycle of the silicon-carbon composite anode material for lithium ion batteries obtained in Example 1.
Figure 5:
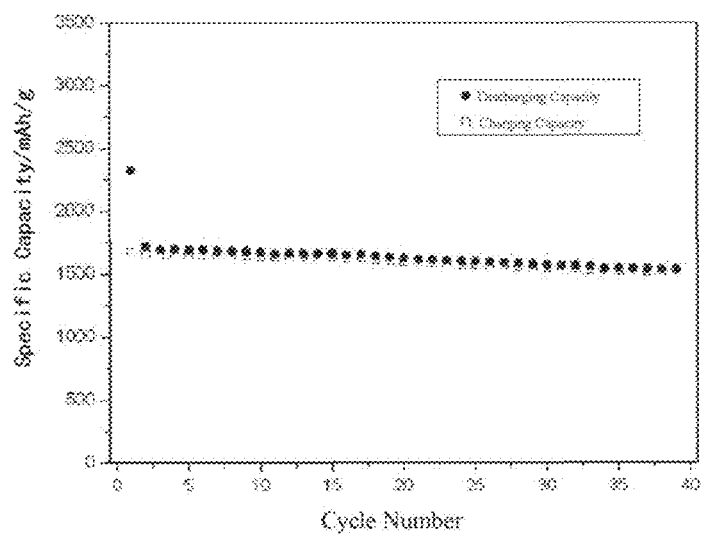
FIG. 5 shows the capacity versus cycle number curve of the first 40 cycles of the lithium ion battery assembled from the silicon-carbon composite anode material for lithium ion batteries obtained in Example 1.
Figure 6:
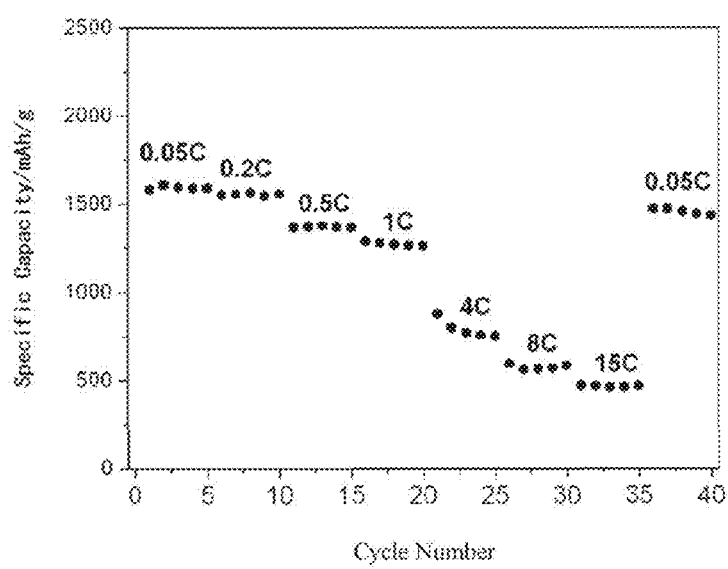
FIG. 6 shows the capacity versus cycle number curve at various rates of the lithium ion battery assembled from the silicon-carbon composite anode material for lithium ion batteries obtained in Example 1.

The silicon-carbon composite anode material for lithium ion batteries thus prepared was assembled into a lithium ion battery, on which charge-discharge tests were carried out. FIG. 4 shows the charge-discharge curve of the first three cycles. FIG. 5 shows the capacity versus cycle number of the first 40 cycles. The initial charge-discharge coulombic efficiency was 72.0%. The reversible capacity after 40 cycles at the rate of 0.2 C was 1509 mAh/g, the capacity retention rate was 90.1%. Tests were carried out at rates of 0.05 C, 0.2 C, 0.5 C, 1 C, 4 C, 8 C and 15 C, the silicon-carbon composite anode material for lithium ion batteries of the present invention showed reversible capacity of 1583 mAh/g, 1556 mAh/g, 1370 mAh/g, 1290 mAh/g, 877 mAh/g, 598 mAh/g and 474 mAh/g, as can be seen in FIG. 6. The electrochemical properties of this material were better than the traditional silicon-carbon composite material.

EXAMPLE 2

Preparation of mesoporous silica: 3.0 g of Pluronic P123 was dissolved in a mixed solution of 22.5 g of water, 3.0 g of 1-butanol and 90.0 g of hydrochloric acid (2 mol/L), after being stirred homogeneously, 6.3 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 4000 r/min, dried at 100° C., and then calcined at 600° C. in an air atmosphere for 2 hours. Thus, mesoporous silica was obtained.

(1) 0.4 g of mesoporous silica and 0.4 g of magnesium powder were placed in a high temperature furnace. In an atmosphere of argon, the temperature was raised to 700° C., and temperature was kept for 6 hours before it was allowed to cool. Then the materials were put into 30 ml of hydrochloric acid (2 mol/L) and stirred for 12 hours. After 4 times of centrifugation at 4000 r/min, and vacuum drying at 80° C. for 12 hours, a porous silicon substrate was obtained;

(2) The porous silicon substrate was placed in a high temperature furnace, where the temperature was raised to 800° C. in an atmosphere of nitrogen. Then toluene was carried into the furnace by nitrogen (the flow rate of nitrogen was 800 ml/min), the temperature was kept for 2 hours. After the disassociation of toluene, a carbon coating layer was formed on the surface of the porous silicon substrate, thus a silicon-carbon composite anode material for lithium ion batteries was obtained.

Figure 7:
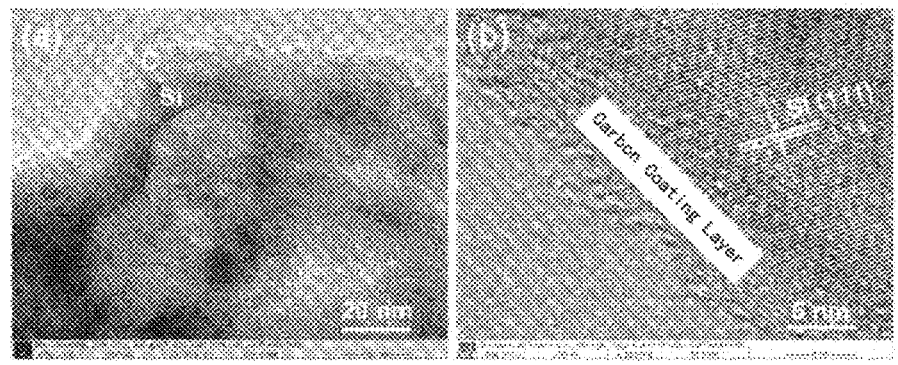
FIG. 7 shows the TEM image of the silicon-carbon composite anode material for lithium ion batteries obtained in Example 2.

The porous silicon substrate was of a polycrystalline structure, the average particle size was 2.4 μm, the average pore size was 35 nm, the pore volume was 0.61 cm$^3$/g, the specific surface area was 73.3 m$^2$/g. FIG. 7 shows a TEM image of the silicon-carbon composite anode material for lithium ion batteries. It can be seen from FIG. 7(*a*) that the material has a porous structure. FIG. 7(*b*) shows the interface of the porous silicon substrate with the carbon coating layer. Crystal plane (111) can be seen from FIG. 7(*b*), and the plane spacing was 0.31 nm. The carbon coating layer consists of amorphous carbon and has a thickness of 5 nm. The carbon coating layer accounted for 25.6 wt %.

The silicon-carbon composite anode material for lithium ion batteries thus prepared was assembled into a lithium ion battery, on which charge-discharge tests were carried out. The initial charge-discharge coulombic efficiency was 75.2%. The reversible capacity after 40 cycles was 1325 mAh/g, and the capacity retention rate was 73.7%.

EXAMPLE 3

Preparation of mesoporous silica: 4.0 g of Pluronic P123 was dissolved in a mixed solution of 30.0 g of water, 4.0 g of 1-butanol and 120.0 g of hydrochloric acid (2 mol/L), after being stirred homogeneously, 8.4 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 4000 r/min, dried at 100° C., and then calcined at 600° C. in an air atmosphere for 2 hours. Thus, mesoporous silica was obtained.

(1) 0.4 g of mesoporous silica and 0.4 g of magnesium powder were placed in a high temperature furnace. In a gas mixture of argon and hydrogen (the content of hydrogen was 5% by volume), the temperature was raised to 750° C., and temperature was kept for 7 hours before it was allowed to cool. Then the materials were put into 30 ml of hydrochloric acid (2 mol/L) and stirred for 12 hours. After 4 times of centrifugation at 4000 r/min, and vacuum drying at 80° C. for 12 hours, a porous silicon substrate was obtained;

(2) The porous silicon substrate was placed in a high temperature furnace, where the temperature was raised to 900° C. in an atmosphere of argon. Then acetylene was carried into the furnace by argon (the volume ratio of argon and acetylene was 4:1 and the total flow rate was 250 ml/min), the temperature was kept for 3 hours. After the disassociation of acetylene, a carbon coating layer was formed on the surface of the porous silicon substrate, thus a silicon-carbon composite anode material for lithium ion batteries was obtained.

Figure 8:
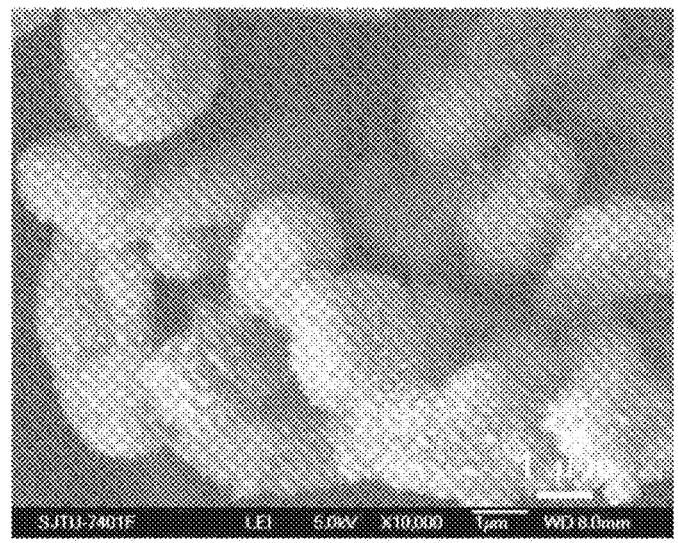
FIG. 8 shows the SEM image of the porous silicon substrate obtained in Example 3.

The porous silicon substrate was of a polycrystalline structure, the average particle size was 2.5 μm, the average pore size was 32 nm, the pore volume was 0.64 cm$^3$/g, the specific surface area was 73.0 m$^2$/g. FIG. 8 shows the morphology. The silicon-carbon composite anode material for lithium ion batteries comprised 34.6 wt % of the carbon coating layer which consists of amorphous carbon and has a thickness of 6 nm.

The silicon-carbon composite anode material for lithium ion batteries thus prepared was assembled into a lithium ion battery, on which charge-discharge tests were carried out. The initial charge-discharge coulombic efficiency was 72.2%. The reversible capacity after 40 cycles was 1570 mAh/g, and the capacity retention rate was 84.8%.

EXAMPLE 4

Preparation of mesoporous silica: 2.0 g of Pluronic P123 was dissolved in a mixed solution of 15 g of water and 60.0 g of hydrochloric acid (2 mol/L), after being stirred homogeneously, 4.2 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 5000 r/min, dried at 90° C., and then calcined at 650° C. in an air atmosphere for 2 hours. Thus, mesoporous silica was obtained.

(1) 0.35 g of mesoporous silica and 0.35 g of magnesium powder were placed in a high temperature furnace. In an atmosphere of argon, the temperature was raised to 700° C., and temperature was kept for 6 hours before it was allowed to cool. Then the materials were put into 30 ml of hydrochloric acid (2 mol/L) and stirred for 12 hours. After 4 times of centrifugation at 5000 r/min, and vacuum drying at 80° C. for 12 hours, a porous silicon substrate was obtained;

(2) The porous silicon substrate was placed in a high temperature furnace, where the temperature was raised to 770° C. in an atmosphere of nitrogen. Then toluene was carried into the furnace by nitrogen (the flow rate of nitrogen was 1000 ml/min), the temperature was kept for 1 hour. After the disassociation of toluene, a carbon coating layer was formed on the surface of the porous silicon substrate, thus a silicon-carbon composite anode material for lithium ion batteries was obtained.

The porous silicon substrate was of a polycrystalline structure, the average particle size was 700 nm, the average pore size was 23 nm, the pore volume was 0.42 cm³/g, the specific surface area was 78.1 m²/g. The silicon-carbon composite anode material for lithium ion batteries comprised 18.3 wt % of the carbon coating layer which consists of amorphous carbon and has a thickness of 4 nm.

The silicon-carbon composite anode material for lithium ion batteries thus prepared was assembled into a lithium ion battery, on which charge-discharge tests were carried out. The initial charge-discharge coulombic efficiency was 76.5%. The reversible capacity after 40 cycles was 1825 mAh/g, and the capacity retention rate was 83.6%.

EXAMPLE 5

Preparation of mesoporous silica: 3.5 g of Pluronic P123 was dissolved in a mixed solution of 26.3 g of water and 105.0 g of hydrochloric acid (2 mol/L), after being stirred homogeneously, 7.4 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 5000 r/min, dried at 80° C., and then calcined at 600° C. in an air atmosphere for 2 hours. Thus, mesoporous silica was obtained.

(1) 0.3 g of mesoporous silica and 0.3 g of magnesium powder were placed in a high temperature furnace. In a gas mixture of argon and hydrogen (the content of hydrogen was 10% by volume), the temperature was raised to 700° C., and temperature was kept for 7 hours before it was allowed to cool. Then the materials were put into 25 ml of hydrochloric acid (2 mol/L) and stirred for 12 hours. After 4 times of centrifugation at 5000 r/min, and vacuum drying at 80° C. for 12 hours, a porous silicon substrate was obtained;

(2) 0.2 g of the porous silicon substrate and 0.7 g of polyvinyl chloride were dispersed in 15 ml of tetrahydrofuran. The mixture were dispersed homogeneously by an ultrasonic treatment and stirring. Then tetrahydrofuran was evaporated, the material was transferred into a high temperature furnace where the temperature was raised to 900° C. in an atmosphere of argon, the temperature was kept for 2 hours. After the disassociation of polyvinyl chloride, a carbon coating layer was formed on the surface of the porous silicon substrate, thus a silicon-carbon composite anode material for lithium ion batteries was obtained.

The porous silicon substrate was of a polycrystalline structure, the average particle size was 650 nm, the average pore size was 24 nm, the pore volume was 0.43 cm³/g, the specific surface area was 77.8 m²/g. The silicon-carbon composite anode material for lithium ion batteries comprised 31.4 wt % of the carbon coating layer which consists of amorphous carbon and has a thickness of 6 nm.

The silicon-carbon composite anode material for lithium ion batteries thus prepared was assembled into a lithium ion battery, on which charge-discharge tests were carried out. The initial charge-discharge coulombic efficiency was 74.1%. The initial lithium intercalation capacity was 1855 mAh/g, the initial lithium deintercalation capacity was 1374 mAh/g.

EXAMPLE 6

Preparation of mesoporous silica: 2.0 g of Pluronic P123 was dissolved in a mixed solution of 15.0 g of water, 2.0 g of 1-butanol and 60.0 g of hydrochloric acid (2 mol/L), after being stirred homogeneously, 4.2 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 6000 r/min, dried at 100° C., and then calcined at 550° C. in an air atmosphere for 2 hours. Thus, mesoporous silica was obtained.

(1) 0.35 g of mesoporous silica and 0.35 g of magnesium powder were placed in a high temperature furnace. In an atmosphere of argon, the temperature was raised to 650° C., and temperature was kept for 7 hours before it was allowed to cool. Then the materials were put into 30 ml of hydrochloric acid (2 mol/L) and stirred for 12 hours. After 4 times of centrifugation at 6000 r/min, and vacuum drying at 80° C. for 12 hours, a porous silicon substrate was obtained;

(2) 0.2 g of the porous silicon substrate and 0.4 g of polyacrylonitrile were dispersed in 10 ml of dimethyl formamide. The mixture were dispersed homogeneously by an ultrasonic treatment and stirring. Then dimethyl formamide was evaporated, the material was transferred into a high temperature furnace where the temperature was raised to 900° C. in an atmosphere of nitrogen, the temperature was kept for 2 hours. After the disassociation of polyacrylonitrile, a carbon coating layer was formed on the surface of the porous silicon substrate, thus a silicon-carbon composite anode material for lithium ion batteries was obtained.

The porous silicon substrate was of a polycrystalline structure, the average particle size was 2.5 μm, the average pore size was 34 nm, the pore volume was 0.66 cm³/g, the specific surface area was 72.8 m²/g. The silicon-carbon composite anode material for lithium ion batteries comprised 20.9 wt % of the carbon coating layer which consists of amorphous carbon and has a thickness of 4 nm.

The silicon-carbon composite anode material for lithium ion batteries thus prepared was assembled into a lithium ion battery, on which charge-discharge tests were carried out. The initial charge-discharge coulombic efficiency was 64.0%. The initial lithium intercalation capacity was 1242 mAh/g, the initial lithium deintercalation capacity was 795 mAh/g.

EXAMPLE 7

Preparation of mesoporous silica: 3.0 g of Pluronic P123 was dissolved in a mixed solution of 22.5 g of water, 3.0 g of 1-butanol and 135.0 g of hydrochloric acid (2 mol/L), after being stirred homogeneously, 9.5 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 5000 r/min, dried at 80° C., and then calcined at 650° C. in an air atmosphere for 2 hours. Thus, mesoporous silica was obtained.

(1) 0.45 g of mesoporous silica and 0.45 g of magnesium powder were placed in a high temperature furnace. In an atmosphere of argon, the temperature was raised to 750° C., and temperature was kept for 6 hours before it was allowed to cool. Then the materials were put into 30 ml of hydrochloric acid (2 mol/L) and stirred for 12 hours. After 4 times of centrifugation at 5000 r/min, and vacuum drying at 80° C. for 12 hours, a porous silicon substrate was obtained;

(2) 0.3 g of the porous silicon substrate and 0.95 g of polyvinyl chloride were dispersed in 10 ml of tetrahydrofuran. The mixture were dispersed homogeneously by an ultrasonic treatment and stirring. Then tetrahydrofuran was evaporated, the material was transferred into a high temperature furnace where the temperature was raised to 900° C. in an atmosphere of argon, the temperature was kept for 4 hours. After the disassociation of polyvinyl chloride, a carbon coating layer was formed on the surface of the porous silicon substrate, thus a silicon-carbon composite anode material for lithium ion batteries was obtained.

The porous silicon substrate was of a polycrystalline structure, the average particle size was 2.6 μm, the average pore size was 33 nm, the pore volume was 0.65 cm$^3$/g, the specific surface area was 72.9 m$^2$/g. The silicon-carbon composite anode material for lithium ion batteries comprised 29.3 wt % of the carbon coating layer which consists of amorphous carbon and has a thickness of 6 nm.

The silicon-carbon composite anode material for lithium ion batteries thus prepared was assembled into a lithium ion battery, on which charge-discharge tests were carried out. The initial charge-discharge coulombic efficiency was 67.2%. The initial lithium intercalation capacity was 1291 mAh/g, the initial lithium deintercalation capacity was 867 mAh/g.

EXAMPLE 8

Preparation of mesoporous silica: 4.0 g of Pluronic P123 was dissolved in a mixed solution of 30.0 g of water and 120.0 g of hydrochloric acid (2 mol/L), after being stirred homogeneously, 8.4 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 5000 r/min, dried at 80° C., and then calcined at 550° C. in an air atmosphere for 2 hours. Thus, mesoporous silica was obtained.

(1) 0.35 g of mesoporous silica and 0.4 g of magnesium powder were placed in a high temperature furnace. In a gas mixture of argon and hydrogen (the content of hydrogen is 10% by volume), the temperature was raised to 700° C., and temperature was kept for 7 hours before it was allowed to cool. Then the materials were put into 30 ml of hydrochloric acid (2 mol/L) and stirred for 12 hours. After 4 times of centrifugation at 5000 r/min, and vacuum drying at 80° C. for 12 hours, a porous silicon substrate was obtained;

(2) 0.25 g of the porous silicon substrate and 0.5 g of polyacrylonitrile were dispersed in 15 ml of dimethyl formamide. The mixture were dispersed homogeneously by an ultrasonic treatment and stirring. Then dimethyl formamide was evaporated, the material was transferred into a high temperature furnace where the temperature was raised to 900° C. in an atmosphere of nitrogen, the temperature was kept for 4 hours. After the disassociation of polyacrylonitrile, a carbon coating layer was formed on the surface of the porous silicon substrate, thus a silicon-carbon composite anode material for lithium ion batteries was obtained.

The porous silicon substrate was of a polycrystalline structure, the average particle size was 600 nm, the average pore size was 24 nm, the pore volume was 0.44 cm$^3$/g, the specific surface area was 77.7 m$^2$/g. The silicon-carbon composite anode material for lithium ion batteries comprised 21.3 wt % of the carbon coating layer which consists of amorphous carbon and has a thickness of 4 nm.

The silicon-carbon composite anode material for lithium ion batteries thus prepared was assembled into a lithium ion battery, on which charge-discharge tests were carried out. The initial charge-discharge coulombic efficiency was 72.0%. The initial lithium intercalation capacity was 1263 mAh/g, the initial lithium deintercalation capacity was 910 mAh/g.

COMPARATIVE EXAMPLE 1

0.15 g of nano silicon powder (particle size: 50 to 150 nm) and 0.45 g of polyvinyl chloride were dispersed in 10 ml of tetrahydrofuran. The mixture were dispersed homogeneously by an ultrasonic treatment and stirring. Then tetrahydrofuran was evaporated, the material was transferred into a high temperature furnace where the temperature was raised to 900° C. in a gas mixture of nitrogen and hydrogen (the content of hydrogen is 5% by volume), the temperature was kept for 2 hours. After the disassociation of polyvinyl chloride and cooling, a silicon-carbon composite material free of pores was obtained. The carbon coating layer accounted for 28.8 wt %, it consisted of amorphous carbon and had a thickness of 6 nm.

Figure 9:
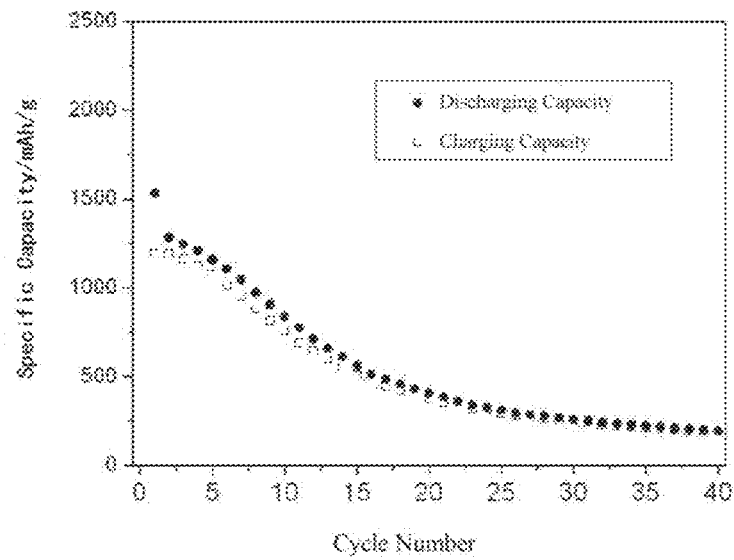
FIG. 9 shows the capacity versus cycle number curve of the first 40 cycles of the lithium ion battery assembled from the silicon-carbon composite material obtained in Comparative Example 1 which does not have a porous structure.

The silicon-carbon composite material thus prepared was assembled into a lithium ion battery, on which charge-discharge tests were carried out. FIG. 9 shows the capacity versus cycle number curve of the first 40 cycles. The initial charge-discharge coulombic efficiency was 78.0%. The initial reversible capacity was 1194 mAh/g, the reversible capacity after 40 cycles was 186 mAh/g, thus the capacity retention rate was only 15.6%.

COMPARATIVE EXAMPLE 2

Preparation of mesoporous silica: 2.0 g of Pluronic P123 was dissolved in a mixed solution of 15.0 g of water, 2.0 g of 1-butanol and 60.0 g of hydrochloric acid (2 mol/L), after being stirred homogeneously, 4.2 g of TEOS was added therein. The mixture was then stirred at 35° C. for 24 hours and transferred into a hydrothermal reaction kettle where the temperature was kept at 100° C. for 24 hour. After being cooled, the mixture was centrifugalized at 5000 r/min, dried at 90° C., and then calcined at 650° C. in an air atmosphere for 2 hours. Thus, mesoporous silica was obtained.

(1) 0.35 g of mesoporous silica and 0.35 g of magnesium powder were placed in a high temperature furnace. In a gas mixture of argon and hydrogen (the content of hydrogen is 5% by volume), the temperature was raised to 700° C., and temperature was kept for 6 hours before it was allowed to cool. Then the materials were put into 30 ml of hydrochloric acid (2 mol/L) and stirred for 12 hours. After 4 times of centrifugation at 5000 r/min, and vacuum drying at 80° C. for 12 hours, a porous silicon substrate was obtained.

The porous silicon substrate was of a polycrystalline structure, the average particle size was 2.5 μm, the average pore size was 34 nm, the pore volume was 0.66 cm$^3$/g, the specific surface area was 72.8 m$^2$/g. No carbon coating layer was formed.

Figure 10:
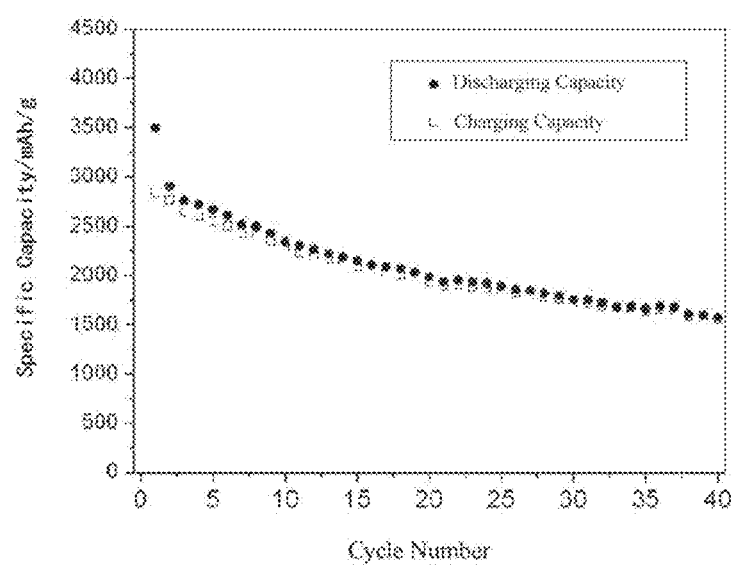
FIG. 10 shows the capacity versus cycle number curve of the first 40 cycles of the lithium ion battery assembled from the porous silicon substrate obtained in Comparative Example 2 which does not have a carbon coating layer.

The silicon-carbon composite material thus prepared was assembled into a lithium ion battery, on which charge-discharge tests were carried out. FIG. 10 shows the capacity versus cycle number curve of the first 40 cycles. The initial charge-discharge coulombic efficiency was 81.1%. The initial reversible capacity was 2837 mAh/g, the reversible capacity after 40 cycles was 1554 mAh/g, thus the capacity retention rate was only 54.8%.

Compared with the silicon-carbon composite material of Comparative Example 1 which does not have a porous structure, it can be seen that the silicon-carbon composite material for lithium ion batteries of the present invention having a porous structure and a carbon coating layer has a better cycle performance. This results from the uniform distribution of the porous structure, which can effectively alleviate the volume effect during the lithium intercalation and deintercalation process and improve the stability of the electrode structure.

Compared with the porous silicon material of Comparative Example 2 which does not have a carbon coating layer, it can be seen that the silicon-carbon composite material for lithium ion batteries of the present invention having a porous structure and a carbon coating layer has a better cycle performance This results from the carbon coating layer which improves conductivity and maintains an electrode conductive network.

The invention claimed is:

1. A silicon-carbon composite anode material for lithium ion batteries, comprising:
   a porous silicon substrate having a polycrystalline structure with a particle size of 50 nm to 20 μm, a pore size of 2 nm to 150 nm, a pore volume of 0.1 cm$^3$/g to 1.5 cm$^3$/g, and a specific surface area of 30 m$^2$/g to 300 m$^2$/g; and
   2 wt % to 70 wt % of a carbon coating layer of amorphous carbon, having a thickness of 2 nm to 30 nm.

2. A method for producing a silicon-carbon composite anode material for lithium ion batteries of claim 1, comprising:
   placing materials of 1 to 3 parts by weight of mesoporous silica and 2 to 4 parts by weight of magnesium powder in a high temperature furnace; adjusting the furnace temperature to 600 to 900° C. in an atmosphere of a protective gas, and maintaining the temperature for 2 to 10 hours before allowing the materials to cool; placing the materials into 40 to 100 parts of hydrochloric acid with a concentration of 1 to 12 mol/L and stirring for 6 to 18 hours; centrifuging 3 to 5 times at 3000 to 10,000 r/min, and vacuum drying at 70 to 120° C. for 6 to 18 hours so as to obtain a porous silicon substrate; and thereafter utilizing the obtained porous silicon substrate for producing a silicon-carbon composite anode material by either:
   placing the porous silicon substrate in a high temperature furnace, adjusting the furnace temperature to 600° C. to 1100° C. in an atmosphere of a protective gas; carrying a gaseous carbon source or a liquid carbon source into the furnace by the protective gas, maintaining the temperature for 1 to 12 hours; forming a carbon coating layer on a surface of the porous silicon substrate after disassociation of the gaseous carbon source or the liquid carbon source so as to obtain a silicon-carbon composite anode material for lithium ion batteries, or
   dispersing the porous silicon substrate and a solid carbon source in a solvent to form a mixture; the mixture being dispersed homogeneously by an ultrasonic treatment and stirring; evaporating the solvent and transferring the resulting material into a high temperature furnace where the temperature is raised to 600° C. to 1100° C. in an atmosphere of a protective gas, maintaining the temperature for 1 to 12 hours; and forming a carbon coating layer on a surface of the porous silicon substrate after disassociation of the solid carbon source so as to obtain a silicon-carbon composite anode material for lithium ion batteries.

3. The method for producing a silicon-carbon composite anode material for lithium ion batteries according to claim 2 wherein the protective gas is selected from the group consisting of argon, nitrogen, helium, a gas mixture of argon and hydrogen, and a gas mixture of nitrogen and hydrogen, the content of hydrogen in the gas mixture being 2% to 20% by volume.

4. The method for producing a silicon-carbon composite anode material for lithium ion batteries according to claim 2 wherein the gaseous carbon source is selected from the group consisting of acetylene, methane, ethane, ethylene, propylene and carbon monoxide.

5. The method for producing a silicon-carbon composite anode material for lithium ion batteries according to claim 2 wherein the liquid carbon source is selected from the group consisting of benzene, toluene, xylene, ethanol, n-hexane and cyclohexane.

6. The method for producing a silicon-carbon composite anode material for lithium ion batteries according to claim 2 wherein the solid carbon source is selected from the group consisting of polyvinyl chloride, polyvinylidene fluoride, polyacrylonitrile, polyvinyl alcohol, polystyrene, phenolic resins, epoxy resins, coal tar pitch, petroleum pitch, sucrose and glucose, wherein the molecular weight of polyvinyl chloride is in a range of 50,000 to 120,000, the molecular weight of polyvinylidene fluoride is in a range of 250,000 to 1,000,000, the molecular weight of polyacrylonitrile is in a range of 30,000 to 200,000, the molecular weight of the polyvinyl alcohol is in a range of 20,000 to 300,000, the molecular weight of polystyrene is in a range of 50,000 to 200,000, the molecular weight of phenolic resin is in a range of 500 to 10,000, the molecular weight of epoxy resin is in a range of 300 to 8000.

7. The method for producing a silicon-carbon composite anode material for lithium ion batteries according to claim 2 wherein the solvent is selected from the group consisting of water, ethanol, ethyl ether, acetone, tetrahydrofuran, benzene, toluene, xylene, dimethyl formamide and N-methyl pyrrolidone.

* * * * *